(12) United States Patent
Takizawa

(10) Patent No.: US 6,342,436 B1
(45) Date of Patent: *Jan. 29, 2002

(54) METHOD OF MANUFACTURING SEMICONDUCTOR SUBSTRATE AND METHOD OF MANUFACTURING SOLID-STATE IMAGE-PICKUP DEVICE

(75) Inventor: Ritsuo Takizawa, Tokyo (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/224,353

(22) Filed: Jan. 4, 1999

(30) Foreign Application Priority Data

Jan. 4, 1998 (JP) .......................... 10-001623

(51) Int. Cl.[7] .............................. H01L 21/322
(52) U.S. Cl. .......................... 438/473; 438/58
(58) Field of Search ................ 438/48, 16, 57, 438/58, 60, 473

(56) References Cited

U.S. PATENT DOCUMENTS 4,868,133 A * 9/1989 Huber .......................... 437/10
5,405,803 A * 4/1995 Kusaka ......................... 437/95
5,453,385 A * 9/1995 Shinji .......................... 437/11
5,874,348 A   2/1999 Takizawa et al.

OTHER PUBLICATIONS

"Concise encyclopedia of semiconducting materials & related technologies" editors S. Mahajan and L.C. Kimerling, 1992, p. 473.*

U.S. application No. 08/862,394, Takizawa et al., filed May, 1997.

* cited by examiner

Primary Examiner—Richard Elms
Assistant Examiner—Bradley Smith
(74) Attorney, Agent, or Firm—Ronald P. Kananen; Rader, Fishman & Grauer

(57) ABSTRACT

There is a provided a method of manufacturing a semiconductor substrate in which generation of bright points after epitaxial growth is reduced, and there is provided a method of manufacturing a solid-state image-pickup device in which illuminated defects are reduced. In fabrication of an epitaxial semiconductor substrate for a solid-state image-pickup device, an epitaxial layer is grown at a growth temperature of 1,120° C. or lower. Pre-annealing is preferably performed at a temperature of 900° C. or lower before hydrogen annealing.

16 Claims, 6 Drawing Sheets

F I G. 7D
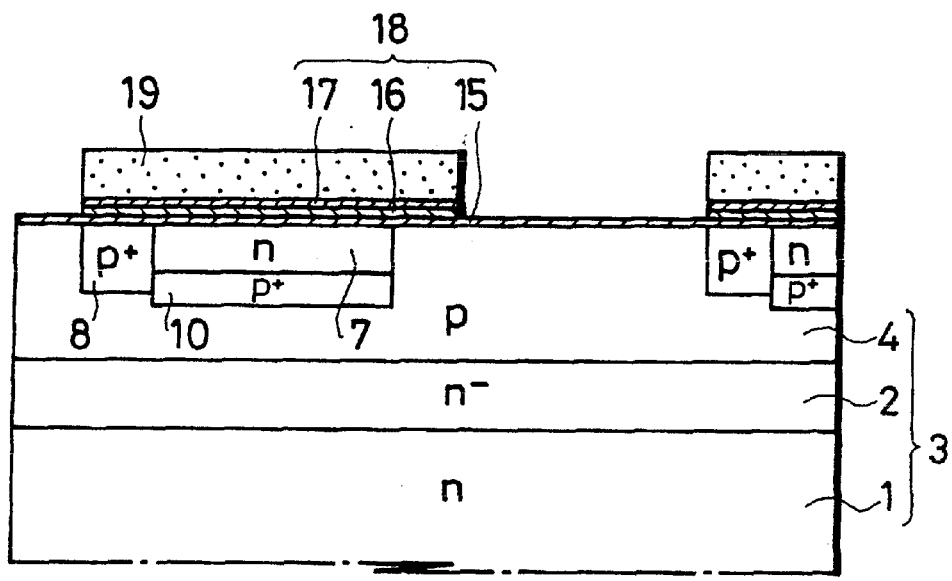
F I G. 7E
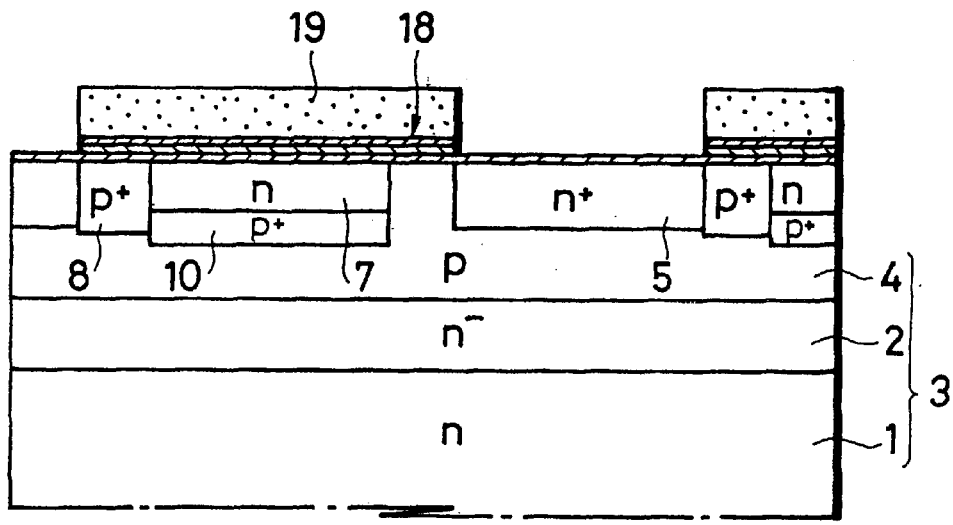

METHOD OF MANUFACTURING SEMICONDUCTOR SUBSTRATE AND METHOD OF MANUFACTURING SOLID-STATE IMAGE-PICKUP DEVICE

BACKGROUND OF THE INVENTION

1. Field of the Invention

The present invention relates to a method of manufacturing a semiconductor substrate such as an epitaxial substrate or the like used in formation of a semiconductor device such as a solid-state image-pickup device or the like and to a method of manufacturing a solid-state image-pickup device fabricated by using the semiconductor substrate.

2. Description of the Related Art

As a semiconductor substrate for forming a semiconductor device such as a solid-state image-pickup device or the like, a CZ substrate grown by a CZ (Czochoralski) method, an MCZ substrate grown by an MCZ (Magnetic field Czochoralski) method, an epitaxial semiconductor substrate obtained by forming an epitaxial layer on the surface of the CZ substrate or the MCZ substrate, or the like is generally used in many cases.

In particular, for a solid-state image-pickup device, an epitaxial semiconductor substrate or an MCZ substrate is mainly used so as to reduce an uneven image contrast caused by an uneven dopant concentration (Striation).

When the epitaxial semiconductor substrate of the above substrates is used, a low-resistance region can be formed under an element formation layer by forming a buried region or using a low-resistance substrate. For this reason, the epitaxial semiconductor substrate is effective for low-voltage drive or low power consumption, and the use of the epitaxial semiconductor substrate is expected to be widened in the future.

In a silicon epitaxial semiconductor substrate, a CVD (Chemical Vapor Deposition) method is used as a practical method, and the following four types of major source gases are used.

In a hydrogen reduction process, two types of source gases, i.e., $SiCl_4$ [$SiCl_4+2H_2 \rightarrow Si+4HCl$] and $SiHCl_3$ [$SiHCl_3+H_2 \rightarrow Si+3HCl$] are used.

In a thermal decomposition method, two types of source gases, i.e., $SiH_2Cl_2$ [$SiH_2Cl_2 \rightarrow Si+2HCl$] and $SiH_4$ [$SiH_4 \rightarrow Si+2H_2$] are used.

Of these source gases, $SiHCl_3$ is mainly used for a solid-state image-pickup device because $SiHCL_3$ is expensive, and has a high growing rate to be suitable for thick-film epitaxial.

However, at present, in an epitaxial substrate formed by using any one of the source gases described above, a large amount of impurity, especially metal impurity, is mixed in the step of forming an epitaxial layer, and illuminated defects caused by a dark current of a solid-state image-pickup device cannot be sufficiently reduced in number. For this reason, the impurity is a factor that degrades characteristics or a manufacturing yield.

Therefore, the present applicant has proposed the following manufacturing method. That is, in manufacturing of an epitaxial wafer for a solid-state image-pickup device, when an element whose family is the same as that of silicon is implanted at a concentration of $1 \times 10^{16}$ $cm^{-3}$ or more in a silicon substrate before epitaxial to obtain excellent getter performance, and, by using a wafer epitaxially grown on the substrate, illuminated defects caused by a dark current of a solid-state image-pickup device can be considerably reduced in number (see Japanese Patent Application No. 6-23145).

As an example of the above method, a so-called carbon gettering in which carbon atoms are ion-implanted at a dose of $1 \times 10^{14}$ $cm^{-2}$ has been proposed in the patent application.

However, in this case, the following problem is posed. Since high-concentration carbon is implanted in a silicon surface, unevenness of the wafer surface is degraded by impact, and the wafer surface is coarsened. For this reason, bright points are degraded after epitaxial growth, and new illuminated defects caused by the bright points are degraded.

SUMMARY OF THE INVENTION

In order to solve the above problem, according to the present invention, there is provided a method of manufacturing a semiconductor substrate in which generation of bright points after epitaxial growth is reduced.

The present invention is also to provide a method of manufacturing a solid-state image-pickup device in which illuminated defects are reduced in number.

In a method of manufacturing a semiconductor substrate according to the present invention, an epitaxial layer is grown at a growth temperature of 1,120° C. or lower to fabricate an epitaxial semiconductor substrate for a solid-state image-pickup device.

In a method of manufacturing a semiconductor substrate according to the present invention, pre-annealing is performed at a temperature of 900° C. or lower before hydrogen annealing, and an epitaxial layer is grown after hydrogen annealing to fabricate an epitaxial semiconductor substrate for a solid-state image-pickup device.

In a method of manufacturing a semiconductor substrate according to the present invention, pre-annealing is performed at a temperature of 900° C. or lower before hydrogen annealing, and an epitaxial layer is grown at 1,120° C. or lower to fabricate an epitaxial semiconductor substrate for a solid-state image-pickup device.

In a method of manufacturing a solid-state image-pickup device, an epitaxial layer is grown at a growth temperature of 1,120° C. or lower, an epitaxial layer is grown after hydrogen annealing to fabricate an epitaxial semiconductor substrate, and a solid-state image-pickup device is fabricated on the epitaxial layer of, the epitaxial semiconductor substrate.

In a method of manufacturing a solid-state image-pickup device according to the present invention, an epitaxial semiconductor substrate subjected to pre-annealing at a temperature of 900° C. or lower before the hydrogen annealing is fabricated, and a solid-state image-pickup element is fabricated on an epitaxial layer of the epitaxial semiconductor substrate.

In a method of manufacturing a solid-state image-pickup device according to the present invention, pre-annealing is performed at a temperature of 900° C. or lower before the hydrogen annealing, an epitaxial semiconductor substrate whose epitaxial layer is grown at a growth temperature of 1,120° C. or lower is fabricated, and a solid-state image-pickup element is fabricated on the epitaxial layer of the epitaxial semiconductor substrate.

According to the present invention described above, pre-annealing is performed at a temperature of 900° C. or lower, or the epitaxial layer is grown at a growth temperature of 1,120° C. or lower, so that bright points after epitaxial growth can be reduced in number.

A solid-state image-pickup element is fabricated on the epitaxial layer of the epitaxial semiconductor substrate in which bright points are reduced in number to thereby constitute a solid-state image-pickup device, so that illuminated defects caused by the bright points can be reduced in number.

BRIEF DESCRIPTION OF THE DRAWINGS

FIGS. 7D and 7E are views showing the steps in manufacturing the solid-state image-pickup device according to the present invention.

DESCRIPTION OF THE PREFERRED EMBODIMENT

Figure 1:
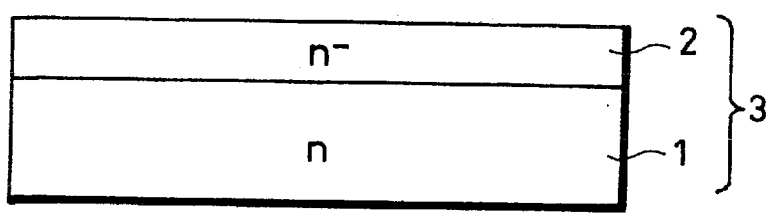
FIG. 1 is a sectional view showing an outline arrangement of an epitaxial semiconductor substrate according to the present invention.

The present invention is a method of manufacturing a semiconductor substrate whose epitaxial layer is grown at a growth temperature of 1,120° C. or lower in fabrication of an epitaxial semiconductor substrate for a solid-state image-pickup device.

According to the present invention, in the method of manufacturing a semiconductor substrate, an epitaxial layer is grown on a semiconductor substrate subjected to carbon implantation by a carbon getter method.

The present invention is a method of manufacturing a semiconductor substrate in which, in fabrication of an epitaxial semiconductor substrate for a solid-state image-pickup device, pre-annealing is performed at a temperature of 900° C. or lower before hydrogen annealing, and an epitaxial layer is grown after the hydrogen annealing.

According to the present invention, in the method of manufacturing a semiconductor substrate, pre-annealing is performed to the semiconductor substrate subjected to carbon implantation by a carbon getter method.

The present invention is a method of manufacturing a semiconductor substrate in which, in fabrication of an epitaxial semiconductor substrate for a solid-state image-pickup device, pre-annealing is performed at a temperature of 900° C. or lower before the hydrogen annealing, and an epitaxial layer is grown at a growth temperature of 1,120° C. or lower.

According to the present invention, in the method of manufacturing a semiconductor substrate, pre-annealing is performed to the semiconductor substrate subjected to carbon implantation by a carbon getter method to thereby grow the epitaxial layer.

The present invention is a method of manufacturing a solid-state image-pickup device in which an epitaxial layer is grown at a growth temperature of 1,120° C. or lower to fabricate an epitaxial semiconductor substrate, and a solid-state image-pickup element is formed on the epitaxial layer of the epitaxial semiconductor substrate.

The epitaxial semiconductor substrate may be fabricated such that the epitaxial layer is grown at the above temperature on a semiconductor substrate subjected to carbon implantation by a carbon getter method.

The present invention is a method of manufacturing a solid-state image-pickup device in which pre-annealing is performed at a temperature of 900° C. or lower before hydrogen annealing, an epitaxial layer is grown after the hydrogen annealing to thereby fabricate an epitaxial semiconductor substrate, and a solid-state image-pickup element is formed on the epitaxial layer of the epitaxial semiconductor substrate.

The epitaxial semiconductor substrate may be fabricated such that, after the pre-annealing and the hydrogen annealing are performed to a semiconductor substrate subjected to carbon implantation by a carbon getter method, the epitaxial layer is grown.

The present invention is a method of manufacturing a solid-state image-pickup device in which pre-annealing is performed at a temperature of 900° C. or lower before hydrogen annealing, an epitaxial semiconductor substrate whose epitaxial layer is grown at a growth temperature of 1,120° C. or lower is fabricated, and a solid-state image-pickup element is formed on the epitaxial layer of the epitaxial semiconductor substrate.

The epitaxial semiconductor substrate may be fabricated such that, after the pre-annealing and the hydrogen annealing are performed to a semiconductor substrate subjected to carbon implantation by a carbon getter method, the epitaxial layer is grown at the above temperature.

Prior to the explanation of an embodiment of the present invention, the outline of the present invention will be described below.

For comparison, a conventional silicon epitaxial growing method is described here.

A silicon substrate is set on a susceptor of an epitaxial apparatus at a room temperature.

After nitrogen purge is performed, a nitrogen gas is substituted for a hydrogen gas, and the temperature of the hydrogen gas is increased to a hydrogen annealing temperature (generally, an epitaxial growth temperature plus+20° C.) at a rate of about 70 to 100° C./min.

Although this hydrogen annealing is performed to remove a spontaneous oxide film or the like formed on the surface of a silicon substrate, an HCl gas may be mixed to lightly etch the silicon surface off and to expose a cleaned surface.

Next, the temperature is decreased to a desired epitaxial growth temperature, a source gas such as $SiHCL_3$ or the like is mixed with the hydrogen gas, and epitaxial growth is performed at a rate of about 1.0 μm/min.

Thereafter, the source gas is cut off to switch the gas to a hydrogen gas, and the temperature is decreased to the room temperature by natural cooling. An epitaxial wafer is taken out after nitrogen purge is performed again.

An epitaxial growth temperature used when, for example, $SiHCL_3$ is used as the source gas is generally about 1,130 to 1,150° C.

By the way, it is generally said that bright points caused by a by-product after epitaxial growth are not easily generated as the growth temperature increases.

It has not been reported that bright points caused by the unevenness of a substrate surface after epitaxial growth is related to the growth temperature.

In order to reduce generation of bright points on an epitaxial semiconductor substrate and illuminated defects of a solid-state image-pickup device caused by the bright points, a fundamental solution in which the unevenness of the wafer surface generated in high-concentration carbon ion implantation is prevented from being degraded is provided.

As a result of examination of the conditions of various epitaxial growths, the following was found out. That is, even if an wafer surface is uneven to some extent, if the conditions of epitaxial growth are optimized, the unevenness of the surface is recovered to stably reduce bright points in number after epitaxial growth.

An embodiment of the present invention will be described below with reference to the accompanying drawings.

An epitaxial semiconductor substrate 3 in which an n-type (phosphorus-doped) silicon epitaxial layer 2 having a thickness of 12 μm and a resistivity of 40 to 50 Ωcm was grown on a 5-inch-diameter CZ silicon substrate 1 shown in FIG. 1 (n-type phosphorus-doped substrate having a growth orientation <100> and a resistivity of 8 to 12 Ωcm) by using an $SiHCl_3$ gas as a source gas was fabricated.

In this case, carbon is introduced in the substrate at a dose amount of $1 \times 10^{14}$ cm$^{-2}$ to perform carbon gettering.

The epitaxial layer 2 is grown without adding HCl for etching.

Figure 2:
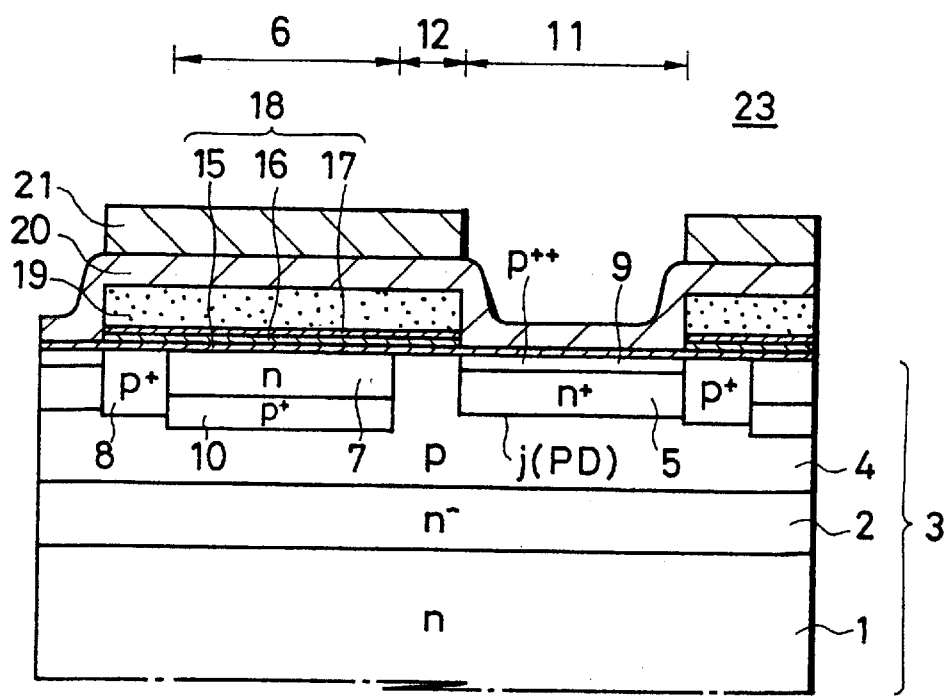
FIG. 2 is a configuration view showing a solid-state image-pickup device according to the present invention.

Each of the CCD solid-state image-pickup elements was formed on the epitaxial semiconductor layer 2 to fabricate a solid-state image-pickup device 23 as shown in FIG. 2.

In the solid-state image-pickup device 23, a p-type well region 4 is formed on the n-type epitaxial layer 2 of the epitaxial semiconductor substrate 3, and an n-type impurity diffusion region 5, and an n-type transfer channel region 7 and a p-type channel stop region 8 which constitute a vertical transfer register 6 are formed in the p-type well region 4. A p-type region 9 is formed on the n-type impurity diffusion region 5, and a second p-type well region 10 is formed beneath the n-type transfer channel region 7.

A light-receiving unit (photo-electric converter) 11 is constituted by a photodiode PD obtained by a p-n junction j between the n-type impurity diffusion region 5 and the p-type well region 4. The light-receiving unit 11 serves as a pixel. A plurality of light-receiving units 11 are arranged in a matrix fashion.

A plurality of transfer electrodes 19 constituted by first and second polycrystalline silicons are formed on the n-type transfer channel region 7 and the p-type channel stop region 8, which constitute the vertical transfer register 6, and a gate unit 12 through a gate insulating film 18 constituted by, e.g., an $SiO_2$ film 15, an $Si_3N_4$ film 16 and an $SiO_2$ film 17.

An Al light-shielding film 21 is formed to cover each of the vertical transfer registers 6 through an interlayer insulating layer 20.

The amounts of unevenness of the surface and bright points after epitaxial growth can be estimated by a dust counter.

For example, when the unevenness and bright points each having 0.13 μm or larger after carbon gettering were estimated, the estimated value was 1,500 to 2,000 (arbitrary unit).

Figure 3:
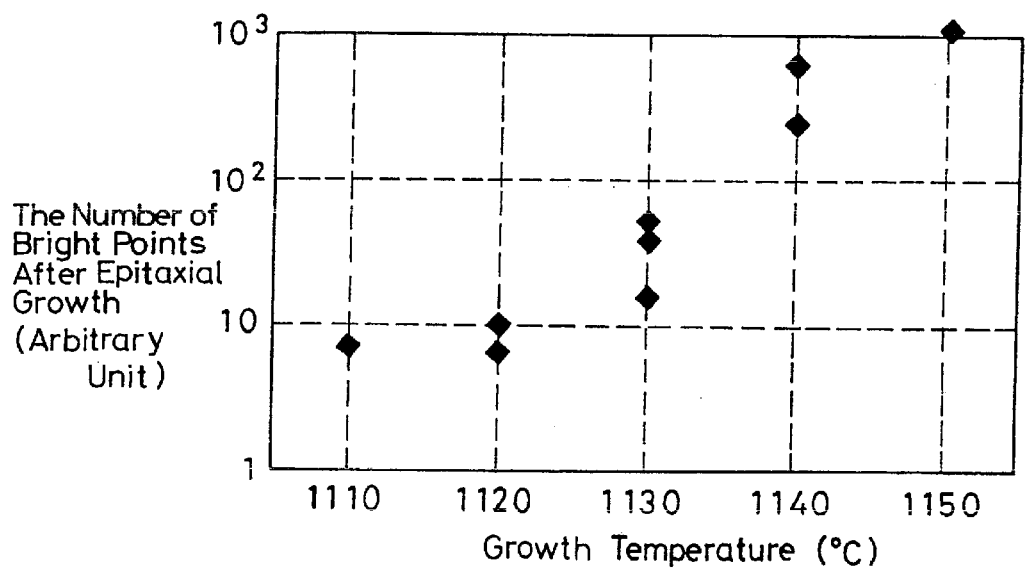
FIG. 3 is a graph showing growth temperature dependency of the number of bright points after epitaxial growth in an epitaxial semiconductor substrate serving for the explanation of the present invention.

FIG. 3 shows a correlation between a growth temperature at which an epitaxial layer is grown and the number of bright points after epitaxial growth. The number of bright points are indicated in an arbitrary unit. FIG. 3 shows data obtained when pre-annealing is performed at 950° C. before hydrogen annealing.

As is apparent from FIG. 3, when the growth temperature is set to be 1,120° C. or lower, the number of bright points after epitaxial growth is considerably reduced, i.e., 10 (arbitrary unit).

Figure 4:
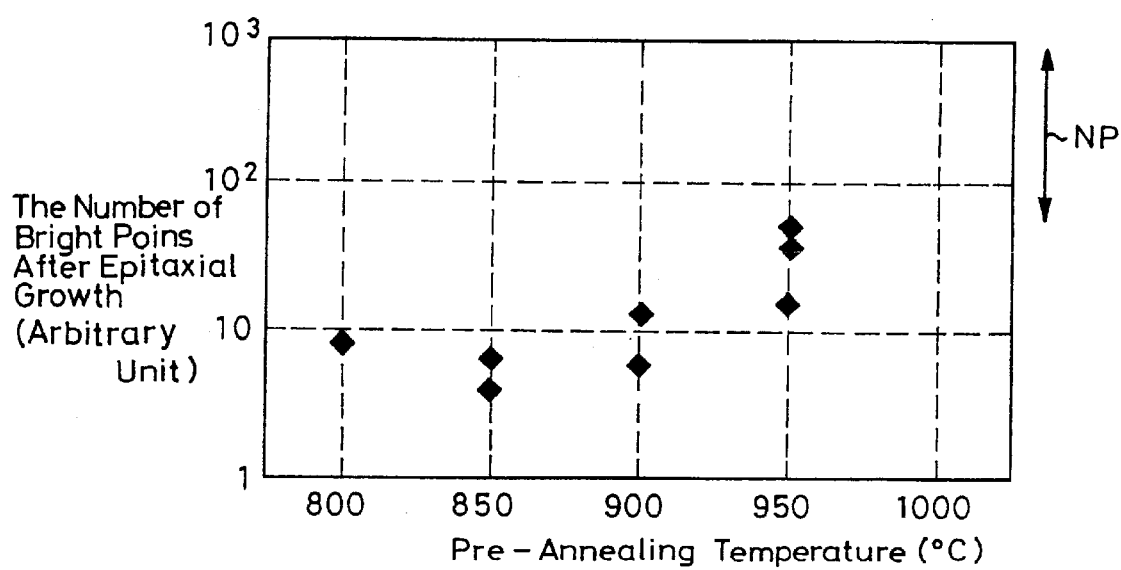
FIG. 4 is a graph showing pre-annealing temperature dependency of the number of bright points after epitaxial growth in the epitaxial semiconductor substrate serving for the explanation of the present invention.

FIG. 4 shows a correlation between a pre-annealing temperature and the number of bright points after epitaxial growth.

A range NP indicated by an arrow located at the right end of the graph denotes the range of the number of bright points obtained when pre-annealing is not performed as in a prior art. FIG. 4 shows data obtained when an epitaxial layer is grown at a growth temperature of 1,130° C.

As is apparent from FIG. 4, when the pre-annealing is additionally performed before the hydrogen annealing, the number of bright points after epitaxial growth can be reduced from 50 to 1,000 (arbitrary unit) obtained in the range NP of the prior art. In addition, it is understood that, when the pre-annealing temperature is set to be 900° C. or lower, the bright points can be considerably reduced in number.

Figure 5:
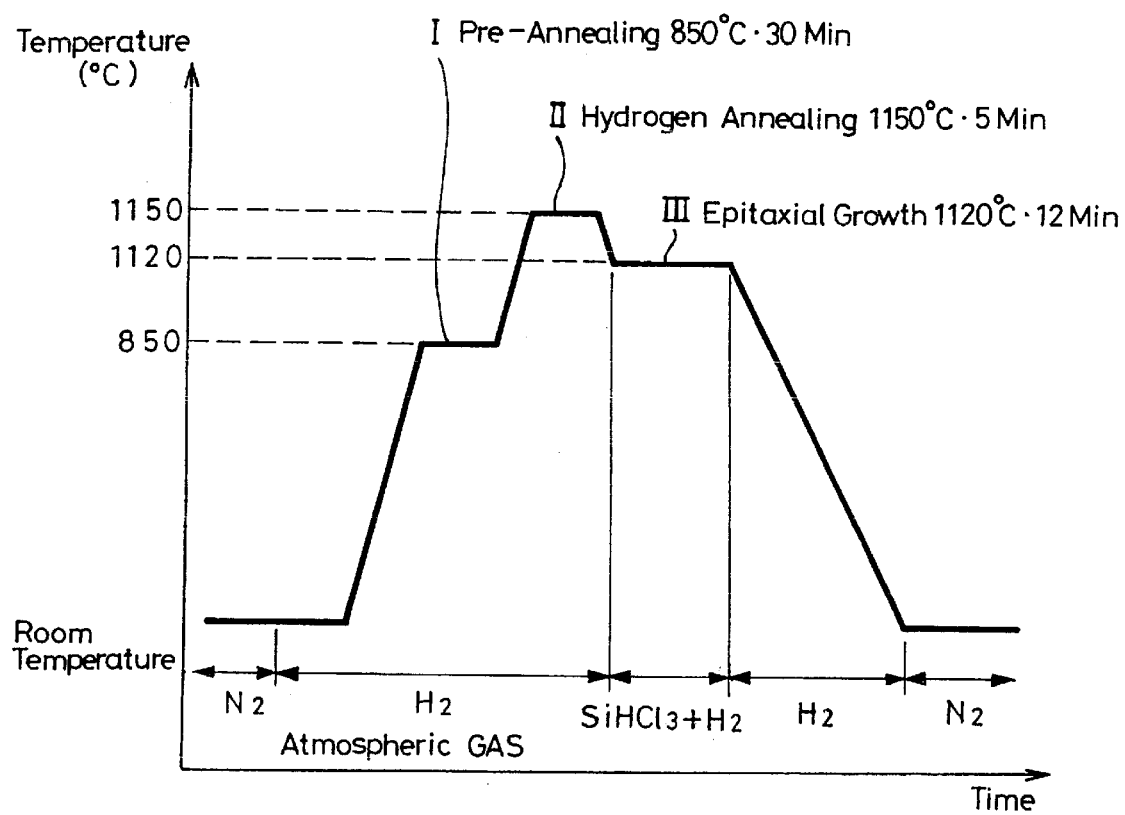
FIG. 5 is a graph showing the manufacturing conditions of manufacturing steps according to an embodiment of the present invention.

FIG. 5 is a graph showing manufacturing conditions obtained when optimum manufacturing conditions are selected and executed on the basis of the above result. In FIG. 5, the ordinate indicates a temperature (° C.), the abscissa indicates elapse of time, a lower level denotes atmospheric gases in the device, and a polygonal line indicates hysteresis.

In the conditions in FIG. 5, the pre-annealing is performed at 900° C. or lower, and an epitaxial growth temperature is set to be 1,120° C. From FIGS. 3 and 4, bright points can be reduced in number by only one of the conditions. However, when the two conditions are combined to each other as shown in FIG. 5, bright points can be more effectively reduced in number.

A method of fabricating a silicon epitaxial wafer will be described below with reference to FIG. 5.

Firstly, a silicon substrate is set on a susceptor of an epitaxial apparatus at a room temperature.

After nitrogen purge is performed, a nitrogen gas is substituted for a hydrogen gas, and the temperature of the hydrogen gas is increased to a pre-annealing temperature of, e.g., 850° C. at a rate of about 70 to 100° C./min, and pre-annealing (process I) is performed for, e.g., 30 minutes.

The temperature is increased to a hydrogen annealing temperature of, e.g., 1,150° C., and hydrogen annealing (process II) is performed for, e.g., 5 minutes.

The temperature is decreased to an epitaxial growth temperature of, e.g., 1,120° C., a source gas such as $SiHCL_3$ is mixed with hydrogen, and epitaxial growth (process III) is performed for, e.g., 12 minutes.

Thereafter, the source gas is cut off to switch the gas to a hydrogen gas, and the temperature is decreased to the room temperature by natural cooling. Then, an epitaxial wafer is taken out after nitrogen purge is performed again.

When the epitaxial wafer is fabricated as described above, as described above, the epitaxial wafer having a small number of bright points can be obtained.

Subsequently, the method of manufacturing a solid-state image-pickup device according to the present invention shown in FIG. 2 will be described below with reference to FIGS. 6 to 8. This embodiment is obtained by applying the present invention to a CCD solid-state image-pickup device.

Figure 6A:
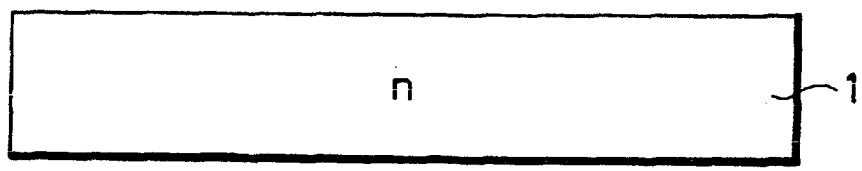
FIGS. 6A to 6C are views showing the steps in manufacturing a solid-state image-pickup device according to the present invention.

First of all, as shown in FIG. 6A, an n-type CZ silicon substrate 1 is formed. The silicon substrate 1 is a 5-inch-diameter substrate having a major surface with a (100) plane and a resistivity of 10 Ω·cm, and carbon is implanted in the surface of the substrate 1 at a dose amount of $1 \times 10^{15}$ cm$^{-2}$.

Figure 6B:
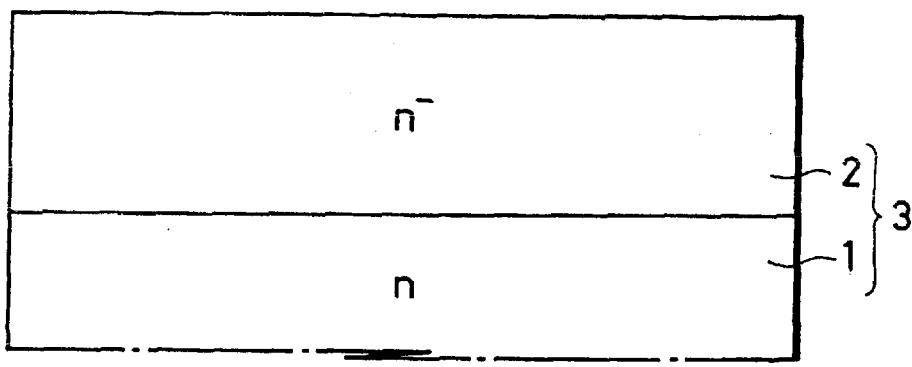

Next, as shown in FIG. 6B, an n-type epitaxial layer 2 having a thickness of about 12 μm is grown on one major surface of the substrate 1 at an epitaxial growth temperature of 1,120° C. by using a hydrogen reduction method using SiHCl$_3$ as a source gas.

The temperature sequence used here is shown in FIG. 5 as described above. Pre-annealing is performed at 850° C. for 30 minutes.

By the way, PH$_3$ is used as a dope gas serving as an n-type impurity.

The resistivity of the silicon epitaxial layer 2 formed as described above was 40 to 50 Ωcm. The number of bright points was 5 or less, which was a good result.

Figure 6C:
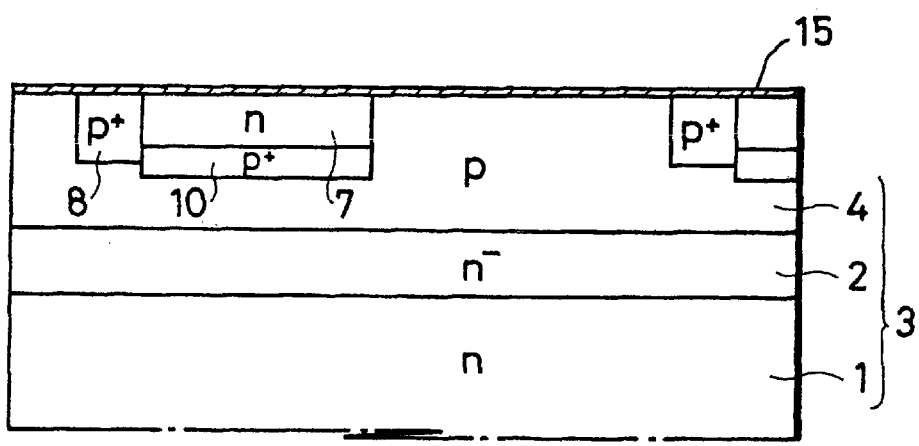

Next, as shown in FIG. 6C, a first p-type well region 4 is formed on the n-type silicon epitaxial layer 2, and an insulating film, e.g., an SiO$_2$ film 15 is formed on the surface of the p-type well region 4. Thereafter, an n-type impurity and a p-type impurity are selectively ion-implanted in the first p-type well region 4 to form an n-type transfer channel region 7, a p-type channel stop region 8, and a second p-type well region 10 which constitute a vertical transfer register.

Then, as shown in FIG. 7D, for example, an Si$_3$N$_4$ film 16 and an SiO$_2$ film 17 are sequentially stacked on the entire surface of the SiO$_2$ film 15, and portions, serving as a light-receiving unit 11, of the Si$_3$N$_4$ film 16 and the SiO$_2$ film 17 are selectively removed by etching. The stacked layer which is not removed, i.e., the stacked layer of the SiO$_2$ film 15, the Si$_3$N$_4$ film 16, and the SiO$_2$ film 17 on the portions corresponding to the n-type transfer channel region 7, the channel stop region 8, and the read-out gate portion 12 constitute as a gate insulating film 18. Thereafter, a transfer electrode 19 constituted by a polysilicon layer is formed on the gate insulating film 18.

Next, as shown in FIG. 7E, an n-type impurity, e.g., phosphorus (P) is selectively ion-implanted in the first p-type well region 4 by using the transfer electrode 19 as a mask, and nitrogen annealing is performed to form an n-type impurity diffusion region 5. At this time, the light-receiving unit 11 is constituted by a photodiode PD obtained by a p-n junction between the n-type impurity diffusion region 5 and the first p-type well region 4.

Figure 8F:
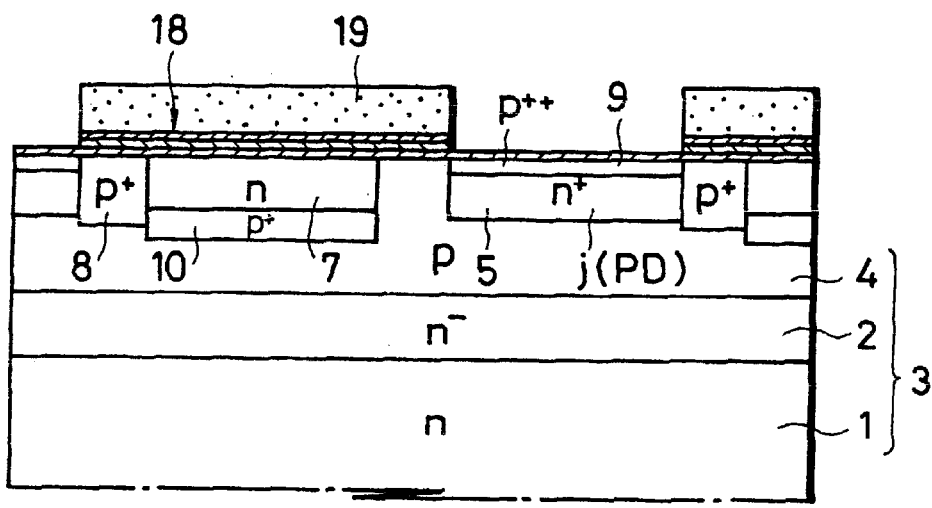
FIGS. 8F and 8G are views showing the steps in manufacturing the solid-state image-pickup device according to the present invention.

Then, as shown in FIG. 8F, a p-type impurity, e.g., boron (B) is selectively ion-implanted in the surface of the light-receiving unit 11 by using the transfer electrodes 19 as a mask, and a thermal process is performed in nitrogen to diffuse and activate the p-type impurity ion-implanted, thereby forming a p-type positive charge accumulation region 9 on the surface of the light-receiving unit 11.

Figure 8G:
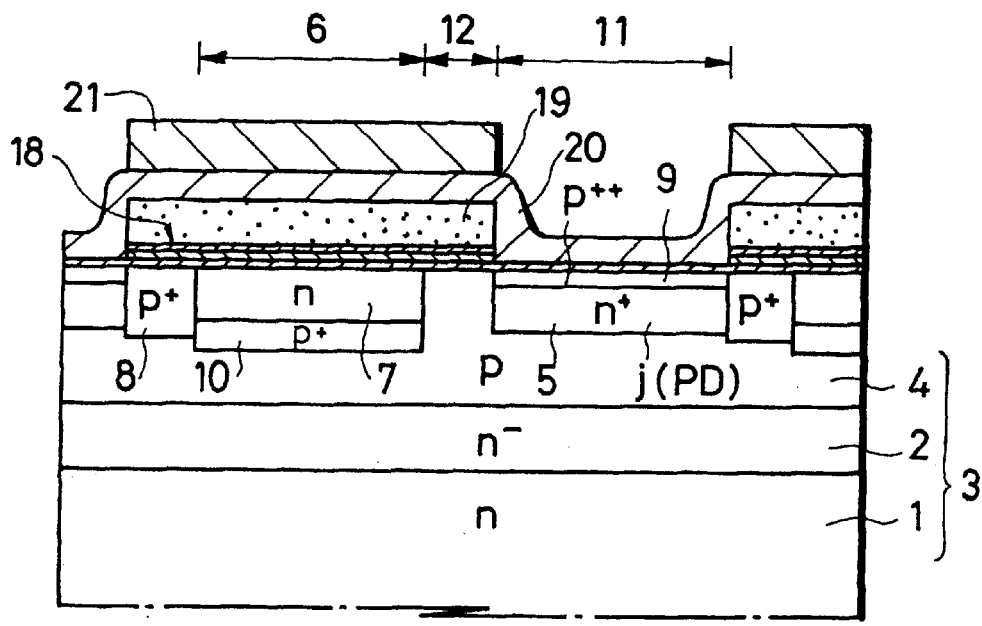

As shown in FIG. 8G, a light-shielding film 21 constituted by an Al layer is selectively formed on the entire surface including the transfer electrode 19 through an interlayer insulating layer 20 consisting of PSG (phosphorus silicate glass) or the like. In this manner, a target solid-state image-pickup device 23 is obtained.

By constituting the solid-state image-pickup device 23 manufactured as described above, the number of illuminated defects can be reduced to ½ or less of the number of illuminated defects obtained in the prior art.

According to the above embodiment, the epitaxial layer 2 is grown at an epitaxial temperature of 1,120° C. or lower, so that the silicon epitaxial substrate 3 in which bright points are rarely generated after the epitaxial growth can be fabricated.

A solid-state image-pickup element is formed on the epitaxial layer 2 by using the silicon epitaxial substrate 3 having a small number of bright points, so that a solid-state image-pickup device in which the number of illuminated defects is considerably reduced can be fabricated.

A silicon substrate subjected to the carbon gettering is used in the above embodiment. However, even when the present invention is also applied to a semiconductor substrate subjected to gettering other than carbon gettering or a semiconductor substrate which is not subjected to gettering, the number of bright points can be reduced.

In the above embodiment, the n-type impurity region is formed on the p-type well region surface formed on the n-type silicon epitaxial substrate, and the photodiode PD is constituted by the p-n junction between the p-type well region and the n-type diffusion region. However, the present invention can also be applied to a case wherein an n-type impurity region is formed on a p-type silicon epitaxial substrate to constitute a photodiode PD.

The present invention can be applied to not only manufacturing of the above CCD solid-state image-pickup device, but also manufacturing of another solid-state image-pickup device, e.g., an amplification type solid-state image-pickup device, a CMOS type solid-state image-pickup device or the like.

In the above embodiment, the present invention is applied to the epitaxial semiconductor substrate obtained by forming the n-type epitaxial layer 2 on the n-type semiconductor substrate 1. However, the present invention is also applied to an epitaxial semiconductor substrate obtained by forming a p-type epitaxial layer on a p-type semiconductor substrate. In addition, the present invention can also be applied to an epitaxial semiconductor substrate obtained by forming an epitaxial layer of a second conductivity type on a semiconductor substrate of a first conductivity type.

An epitaxial substrate according to the manufacturing method of the present invention is applied to not only a solid-state image-pickup device such as a CCD, a CMOS sensor or the like, but also a bipolar type semiconductor device.

The method of manufacturing a semiconductor device according to the present invention and the method of manufacturing a solid-state image-pickup device according to the present invention are not limited to the above embodiment. The present invention can employ various arrangements without departing from the spirit and scope of the invention.

According to the present invention described above, when an epitaxial layer is grown on a semiconductor substrate, the number of bright points after epitaxial growth caused by surface unevenness can be considerably reduced by performing pre-annealing at 900° C. or lower before hydrogen annealing and setting the growth temperature of the epitaxial layer to be 1,120° C. or lower.

Therefore, according to the present invention, when a solid-state image-pickup device is formed by using the epitaxial semiconductor substrate formed as described above, illuminated defects of the solid-state image-pickup device can be considerably reduced in number.

Having described a preferred embodiment of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method of manufacturing an epitaxial semiconductor substrate comprising the steps of:
    implanting carbon in a semiconductor substrate at a dose of at least $10^{15}$ cm$^{-2}$ to perform carbon gettering; and
    growing an epitaxial layer on a semiconductor substrate at a growth temperature above 1,100° C. but no greater than 1,120° C.

2. A method of manufacturing an epitaxial semiconductor substrate according to claim 1, further comprising: the step of implanting carbon in said semiconductor substrate to perform carbon gettering before the step of growing an epitaxial layer.

3. A method of manufacturing an epitaxial semiconductor substrate according to claim 1, wherein a step of performing pre-annealing at a temperature of 900° C. or lower and a step of performing hydrogen annealing are performed in this order before the step of growing an epitaxial layer.

4. A method of manufacturing an epitaxial semiconductor substrate according to claim 3, wherein the step of implanting carbon in said semiconductor substrate to perform carbon gettering occurs before the step of performing pre-annealing.

5. A method of manufacturing an epitaxial semiconductor substrate comprising a step of:
    implanting carbon in a semiconductor substrate at a dose of at least $10^{15}$ cm$^{-2}$ to perform carbon gettering;
    performing pre-annealing to a semiconductor substrate at a temperature of 900° C. or lower for about 30 minutes, thereby reducing a number of bright points following growth of an epitaxial layer;
    performing hydrogen annealing thereafter; and
    growing said epitaxial layer on said semiconductor substrate.

6. A method of manufacturing an epitaxial semiconductor substrate according to claim 5, wherein the step of growing an epitaxial layer is performed at a temperature of 1,120° C. or lower.

7. A method of manufacturing an epitaxial semiconductor substrate according to claim 6, further comprising: the step of implanting carbon in said semiconductor substrate to perform carbon gettering before the step of performing pre-annealing.

8. A method of manufacturing a semiconductor device comprising:
    implanting carbon in a semiconductor substrate at a dose of at least $10^{15}$ cm$^{-2}$ to perform carbon gettering;
    performing pre-annealing to said semiconductor substrate at a temperature of 900° C. or lower;
    performing hydrogen annealing;
    growing an epitaxial layer on said semiconductor substrate, and
    forming a semiconductor element on said epitaxial layer of said epitaxial substrate.

9. A method of manufacturing a semiconductor device according to claim 8, wherein said semiconductor element is a solid-state image-pickup element.

10. A method of manufacturing a semiconductor device, which comprises the steps of:
    implanting carbon in a semiconductor substrate at a dose of at least $10^{15}$ cm$^{-2}$ to perform carbon gettering;
    growing an epitaxial layer on a semiconductor substrate at a growth temperature above 1,100° C. but no greater than 1,120° C.; and
    forming a semiconductor element on said epitaxial layer.

11. A method of manufacturing a semiconductor device according to claim 10, wherein said semiconductor element is a solid-state image-pickup element.

12. A method of manufacturing a semiconductor device according to claim 10, further comprising the step of implanting carbon in said semiconductor substrate to perform carbon gettering before the step of growing an epitaxial layer.

13. A method of manufacturing a semiconductor device according to claim 10, wherein a step of performing pre-annealing at a temperature of 900° C. or lower and a step of performing hydrogen annealing in an atmosphere of a mixture of hydrogen gas and HCl gas are performed in this order before the step of growing an epitaxial layer.

14. A method of manufacturing a semiconductor device according to claim 13, further comprising the step of implanting carbon in said semiconductor substrate at a dose of at least $10^{15}$ cm$^{-2}$ to perform carbon gettering before the step of performing pre-annealing.

15. A method of manufacturing a semiconductor device according to claim 10, wherein a step of performing pre-annealing at a temperature of 900° C. or lower, and sustaining said pre-annealing for a time sufficient to reduce a number of bright points following said step of growing an epitaxial layer, is performed before said step of growing an epitaxial layer.

16. A method of manufacturing a semiconductor device according to claim 15, wherein a step of performing hydrogen annealing in an atmosphere of a mixture of hydrogen gas and HCl gas is performed after said step of performing pre-annealing and before said step of growing an epitaxial layer.

* * * * *